United States Patent [19]

Catchpole et al.

[11] Patent Number: 4,675,739
[45] Date of Patent: Jun. 23, 1987

[54] INTEGRATED RADIATION SENSING ARRAY

[75] Inventors: Clive Catchpole, Birmingham; Zvi Yaniv, Southfield; Vincent D. Cannella, Detroit; John Keem, Bloomfield Hills; Louis D. Swartz, Holly, all of Mich.

[73] Assignee: Energy Conversion Devices, Inc., Troy, Mich.

[21] Appl. No.: 713,928

[22] Filed: Mar. 20, 1985

Related U.S. Application Data

[63] Continuation-in-part of Ser. No. 607,153, May 4, 1984, and a continuation-in-part of Ser. No. 678,105, Dec. 4, 1984, which is a continuation-in-part of Ser. No. 607,153, May 4, 1984.

[51] Int. Cl.[4] ............................................. H04N 3/14
[52] U.S. Cl. ................................................. 358/213.11
[58] Field of Search .................... 358/213, 212, 110; 357/24 LR; 250/578

[56] References Cited

U.S. PATENT DOCUMENTS

| | | | |
|---|---|---|---|
| 3,562,418 | 2/1971 | Glusick et al. | 358/213 |
| 4,226,898 | 10/1980 | Ovshinsky et al. | 357/2 |
| 4,346,406 | 8/1982 | Kato et al. | 358/110 |
| 4,482,804 | 11/1984 | Oritsuki et al. | 250/578 |

Primary Examiner—Gene Z. Rubinson
Assistant Examiner—Stephen Brinich
Attorney, Agent, or Firm—R. S. Nolan; M. S. Siskind; R. M. Goldman

[57] ABSTRACT

An incident radiation sensing apparatus comprises an array of photosensitive elements formed as an integrated circuit on a substrate. Each of the photosensitive elements includes a capacitor for storing charge, a conductive means for charging the capacitor to a preselected magnitude, a blocking means for inhibiting the discharge of charge stored on the capacitor; and a photoresponsive means formed from deposited semiconductor material for generating charge carriers at a rate responsive to the intensity of radiation incident upon the photoresponsive means. The photoresponsive means is connected to the capacitor so that the charge carriers generated in the photoresponsive means reduce the magnitude of the charge on the capacitor as a function of the magnitude of, and the time incidence of, the incident radiation. The apparatus further includes means for sensing the magnitude of charge remaining on the capacitor of a given photosensitive element a preselected period of time after its charging by the conductive means, so as to produce a signal corresponding to the time integral of the magnitude of the incident radiation impinging on the photoresponsive means connected to that capacitor during the preselected period of time. The present invention includes using such a radiation sensor in X-ray imagers, contact-type document copiers, and electronic cameras.

28 Claims, 23 Drawing Figures

INTEGRATED RADIATION SENSING ARRAY

RELATED APPLICATION

The present application is a continuation-in-part of the copending application, Ser. No. 607,153, filed May 4, 1984 for "Contact Type Document Scanner and Method," and is a continuation-in-part of the copending application, Ser. No. 678,105, filed Dec. 4, 1984 for "X-Ray Image Scanner and Method", which, in turn, is also a continuation-in-part of the above mentioned application, Ser. No. 607,153, filed May 4, 1984 for "Contact Type Document Scanner and Method".

FIELD OF THE INVENTION

The present invention relates to electronic radiation sensing devices, and more particularly to solid-state integrated arrays of electronic radiation sensing elements suitable for sensing spatial patterns of varying radiation intensity, such as those associated with light or x-ray images.

BACKGROUND OF THE INVENTION

Electronic radiation sensors have been used in the past for many purposes. They have been commonly used for image sensing in television and video tape cameras, in robotic vision, in aerial reconnaissance, and in document scanning, such as that performed in facsimile machines.

An important prior art electronic image sensing devices is the vidicon television camera tube. The vidicon has a transparent conductive plate at one end. Coated on the transparent conductive plate is a photoconductive layer, upon which a light image is focused through the plate. At the other end of the tube is an electron gun which shoots a beam of electrons in a raster scan upon the opposite side of the photoconductive layer from that touching the transparent plate. Where the image focused on the photoconductive layer is bright, the layer is made relatively conductive, and thus, when the electron beam hits that portion of the layer, its current passes through to the transparent plate on the opposite side, generating a signal indicating the presence of light. On the other hand, where the image is dark, the photoconductive layer remains relatively insulative, preventing the electrons projected upon it from passing through to the transparent conductive plate. As a result, the signal produced at the transparent conductive plate varies as a function of the light intensity of the portion of the image being scanned by the electron beam.

The plumbicon is another type of television camera tube which is similar to the vidicon. But instead of having a simple photoconductive layer, the plumbicon has a PIN photodiode layer formed of three sublayers: a thin P layer in which the majority charge carriers are holes, a thin N layer in which the majority charge carriers are electrons, and a thick central intrinsic layer separating the P and N layers in which there are few charge carriers, but in which the number of holes and electrons is relatively equal. The interfaces between the P and I and the I and N layers form rectifying junctions which tend to prevent negative charge on the P layer, upon which the electron beam is projected, from flowing to the N layer, which either contacts or forms the plumbicon's transparent conductive plate. The electron beam places a capacitive charge across each portion of the PIN layer which it scans. However, when light is focused on a portion of the PIN layer, electron-hole pairs are generated in the intrinsic sublayer, which tend to neutralize the charge placed across that portion of the photodiode layer. As the electron beam makes successive scans, it recharges portions of the P layer discharged since the previous scan. This recharging of the P layer generates a current flow in the transparent conductive plate on the other side of the photodiode by means of capacitive coupling. It is this current flow which forms the video signal. The charge upon a given portion of the photodiode layer tends to be discharged by all the light which hits that given portion between electron scans. Thus the amount of current produced when that given portion is read is a function of the time integral of the amount of light which has fallen on that portion since its last scanning, providing increased sensitivity to light.

Although vidicons and plumbicons produce excellent images, they tend to be relatively bulky, fragile, and expensive because they are vacuum tubes. Thus there has been a demand for a solid-state sensing device. One such device provided by the prior art is the charged-coupled device, or CCD. Charge-coupled devices usually comprise a layer of relatively conductive semiconductor material, such as a layer of material which has been doped to be N type. This layer is usually separated from a layer containing electrodes by an insulator. In a two dimensional charge-coupled image sensing array, an x-y array of transparent imaging electrodes receive a voltage during a integrating period in which an image is to be produced. When light hits the semiconductor, it generates charge carriers, which are attracted by the voltage on the imaging electrodes to the portion of the conductive semiconductor layer below those electrodes. The amount of charge which accumulates under an imaging electrode during a given integrating period corresponds to a time integral of the amount of light which falls on the semiconductor under that imaging electrode during that integration period. When the time comes to read the information produced under a row of such imaging electrodes, the individual packets of charge collected under the imaging electrodes of the row are shifted in parallel, by applying voltage to adjacent electrodes, into a charge-coupled shift register, which then serially shifts the packets to an output device, producing a video signal.

Such charge-coupled devices have many advantages. They are solid-state and thus relatively small and rugged. They also have the advantage of having the position of their photosensitive elements determined in a fixed manner by the location of their imaging electrodes, rather than being determined in a less reliable dynamic manner by the electronic deflection circuitry used in video tubes of the type described above.

Although the charge-coupled device technology provides a suitable video sensor for many applications, it does not appear suited for all applications. For example, the signal produced in its individual photosensitive elements is not randomly addressable, since the signal contained in a given line of such photosensitive elements is read out serially in a shift register. Additionally, charge-coupled devices have traditionally been made on crystalline substrates. Because of the present limitations on the size in which such crystalline substrates can be manufactured, and because of the large cost of such crystalline substrates, charge-coupled device technology is not suited for large area arrays of image sensors, such as those which might be used in contact type document copiers.

SUMMARY OF THE INVENTION

In accordance with the present invention an incident radiation sensing apparatus is provided. This radiation sensing apparatus comprises a substrate and an array of photosensitive elements formed as an integrated circuit on the substrate. Each of the photosensitive elements includes a capacitor means for storing charge, a conductive means for charging the capacitor means to a preselected magnitude, and a blocking means for inhibiting the discharge of charge stored on the capacitor means. Each of the photosensitive elements further includes a photosensitive means formed from deposited semiconductor material for generating charge carriers at a rate responsive to the intensity of radiation incident upon the photoresponsive means. The photoresponsive means associated with each of the photosensitive elements is connected to the capacitor means associated with that element, so that the charge carriers produced in response to incident radiation reduce the magnitude of the charge on the capacitor means as a function of the magnitude of, and the time incidence of, the incident radiation. The radiation sensing apparatus further includes means for sensing the magnitude of charge remaining on a given capacitor means a preselected period of time after its charging by the conductive means, so as to produce a signal corresponding to the time integral of the magnitude of the incident radiation impinging upon the photoresponsive means connected to its associated capacitor means during the preselected period of time.

In a preferred embodiment of the invention, the radiation sensing apparatus includes a plurality of intersecting lines formed on its substrate, and the conductive means associated with each of the photosensitive elements includes a pair of such intersecting lines. Preferably, the means for sensing the magnitude of charge remaining on the capacitor means a preselected time after its charging also includes the same pair of intersecting lines associated with each photosensitive element as is included in the conductive means. Normally the plurality of intersecting lines includes a plurality of generally parallel x lines and a plurality of generally parallel y lines crossing the x lines. When this is the case, the photosensitive elements are formed at the crossing of the x and y lines and the conductive means associated with each photosensitive element includes one x line and one y line.

In the preferred embodiment of the invention, the blocking means for inhibiting the discharge of charge stored on the capacitor means is connected between the capacitor means and a part of the conductive means, so as to inhibit the discharge of the capacitor means through the conductive means. This blocking means normally includes a semiconductor blocking junction, such as that contained in a diode.

In the preferred embodiment of the invention the conductive means for charging the capacitor means to a preselected magnitude further includes means for recharging the capacitor means after the expiration of the preselected period of time, and the means for sensing the magnitude of charge remaining on a capacitor means a preselected period of time after its charging includes means for sensing the amount of current which flows during such a recharging of the capacitor means.

In preferred embodiments of the invention the capacitor means is a capacitor formed of two spaced apart electrodes and the deposited semiconductor material of the photoresponsive means is located between and is electrically connected to those electrodes. In the preferred embodiment, these electrodes are vertically arrayed with respect to each other and the substrate and the semiconductor material of the photoresponsive means is deposited between the electrodes so as to act as a dielectric between them. In the preferred embodiment the semiconductor material of the photoresponsive means includes an amorphous semiconductor alloy, such as an alloy of silicon including either hydrogen or fluorine or both. In the preferred embodiment the deposited semiconductor material forms at least one semiconductor blocking junction which inhibits the discharge of the capacitor in the absence of radiation incident upon the semiconductor material. For example, in certain preferred embodiments, deposited semiconductor material is formed of at least two layers which have their fermi levels positioned differently relative to the energy levels of their respective conduction and valance bands, so as to form one or more blocking junctions. In one embodiment the deposited semiconductor material includes three layers, a bottom layer closest to the substrate formed of a first conductivity type, an intermediate layer formed of a substantially intrinsic type, and a top layer formed of a second conductivity type, with the first and second conductivity types being selected so that the resulting semiconductor junctions between the layers form blocking junctions which inhibit the discharge of the capacitor in the absence of radiation incident upon the semiconductor material. According to certain other preferred embodiments at least one of the electrodes of the capacitor includes a metal which forms a blocking junction which inhibits the discharge of the capacitor when placed in contact with the semiconductor material of the photoresponsive means.

According to another embodiment of the invention, the semiconductor material which is deposited between the electrodes of the capacitor functions as a photoresistor, blocking the discharge of the capacitor by the high resistivity of the semiconductor material in the absence of the incidence of light upon it. In such an embodiment, the deposited semiconductor material is preferably formed of a single layer of substantially intrinsic amorphous semiconductor material.

According to another embodiment of the invention, an incident radiation sensing apparatus of the general type described above at the beginning of this "Summary of The Invention" is provided for use in forming an image of a document placed in close proximity to its array of photosensitive elements. In this embodiment the sensing apparatus includes a transparent spacing means for positioning the document, when it is placed against the spacing means, in spaced-apart proximity to the apparatus's array of photosensitive elements, sufficiently close to that array so that individual photosensitive elements of the array sense the amount of light leaving the surface of the portions of the document placed in close proximity to them.

In a preferred embodiment of such an apparatus for use in forming the image of a document, the integrated circuit in which the array of photosensitive elements is formed is a large area integrated circuit, and the array of photosensitive elements is at least 11" long and 8½" wide. Preferably the integrated circuit is formed so that light can pass through it in the vicinity of each of the photosensitive elements to illuminate a portion of the document placed in close proximity to the photosensitive element without directly illuminating the photosensitive element itself.

According to another embodiment of the present invention, incident radiation sensing apparatus of the type described at the beginning of this "Summary of The Invention" is provided for use in sensing an x-ray image. Such x-ray sensing apparatus comprises converting means overlying its photosensitive elements for producing radiation in response to the impingement of x-rays upon the converting means. The radiation produced by the converting means has a frequency which causes the generation of charge carriers in the photoresponsive means of the apparatus's array of photosensitive elements. As a result, a given photoresponsive means of a given photosensitive element generates charge carriers in correspondence to the amount of x-ray radiation incident upon a portion of the converting layer overlying it. Preferably the converting means comprises a layer of fluorescent material placed in close proximity to the array of photosensitive elements.

In yet another embodiment of the invention, incident radiation sensing apparatus of the type described at the beginning of this "Summary of the Invention" is provided which includes a focusing means for focusing a light image upon its array of photosensitive elements.

BRIEF DESCRIPTION OF THE DRAWINGS

In the drawings, which form an integral part of the specification and which are to be read in conjunction therewith, and in which like reference numerals are employed to designate similar components in various views:

FIGS. 2a through 8a are schematic representations indicating the voltages applied to the row and column address lines of the radiation sensing apparatus shown in FIG. 1, and FIGS. 2b through 8b are schematic circuit diagrams of the photosensitive element contained in the upper left hand corner of the array shown in FIG. 1, indicating the voltages of its various elements during the various phases of the scanning sequence shown in the corresponding FIGS. 2a through 8a;

DETAILED DESCRIPTION OF THE PREFERRED EMBODIMENTS

Figure 1:
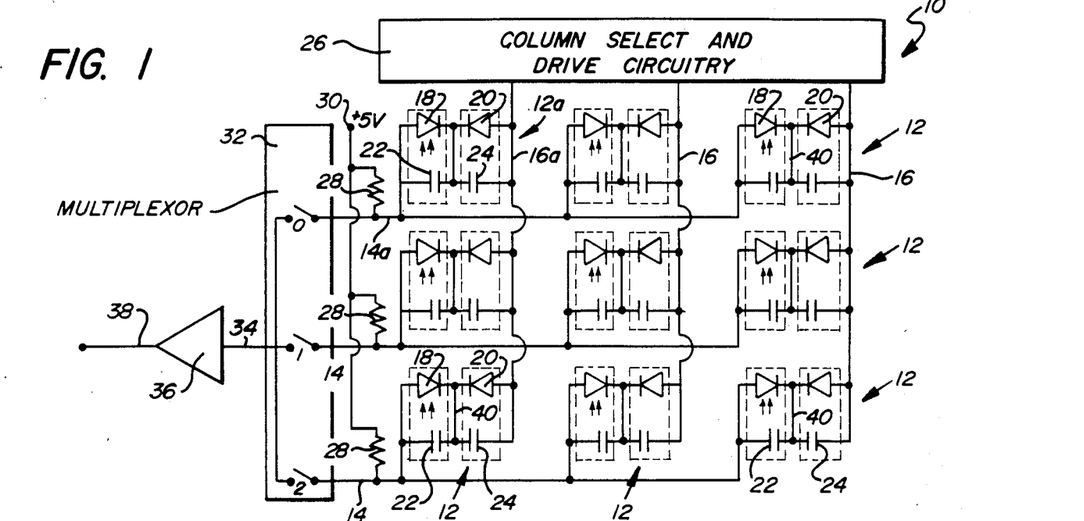
FIG. 1 is a schematic circuit diagram of an incident radiation sensing apparatus according to one embodiment of the present invention.
Figure 9:
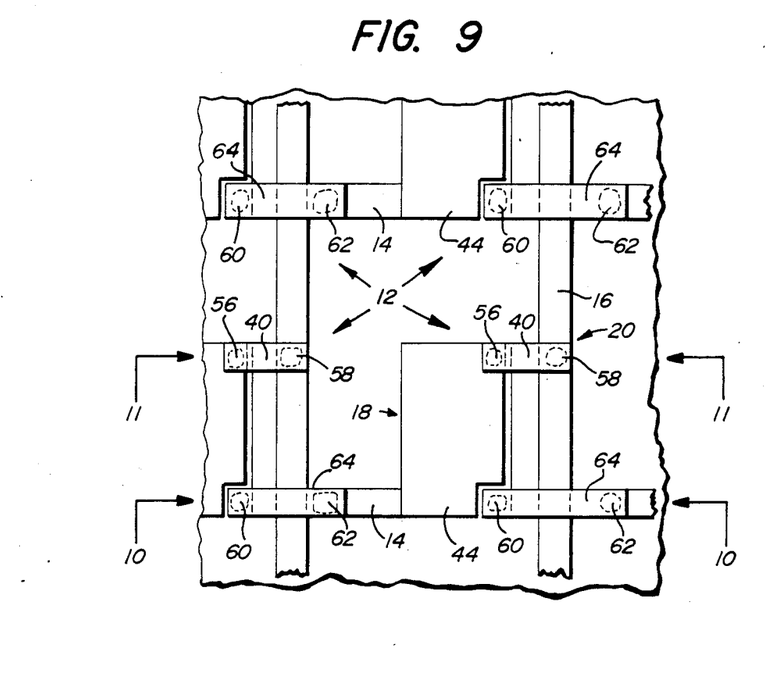
FIG. 9 is a partial top plan view of an integrated circuit in which an array of photosensitive elements have been formed according to an embodiment of the present invention.
Figure 10:
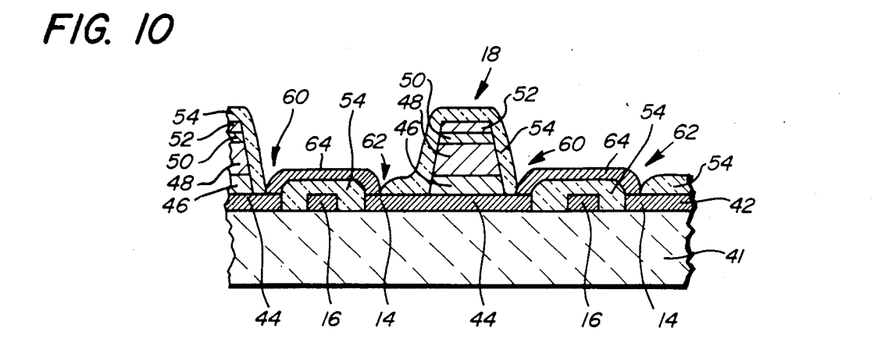
FIG. 10 is a partial cross-sectional side view of the integrated circuit shown in FIG. 9 taken along the line of 10—10 in that figure.
Figure 11:
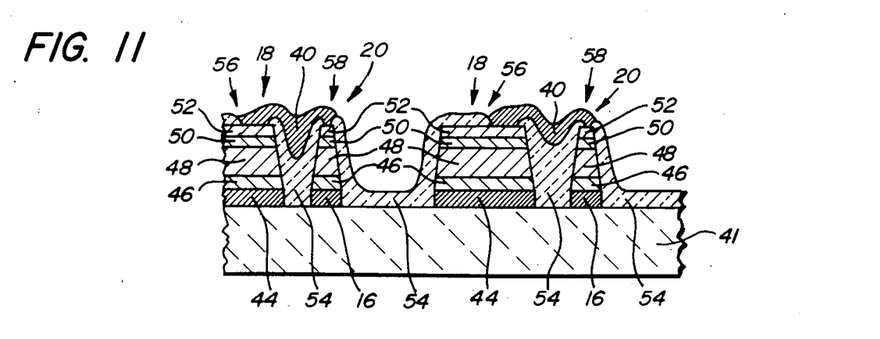
FIG. 11 is a partial cross-sectional side view of the integrated circuit shown in FIG. 9 taken along the line 11—11 shown in that figure.

Referring now to FIG. 1, the circuitry of an incident radiation sensing apparatus 10 embodying the present invention is shown in schematic form. The apparatus 10 comprises an array of photosensitive elements 12 formed as an integrated circuit on a substrate, as shown in FIGS. 9 through 11, below. For purposes of simplification, the array of photosensitive elements 12 shown in FIG. 1 is a 3×3 array. However, in most embodiments of the invention much larger arrays are used.

The photosensitive elements 12 are formed at the crossings of x lines 14 and y lines 16, with one such photosensitive element connected between one x line and one y line near the intersection of those two lines. Each of the photosensitive elements includes two back-to-back diodes, a photoresponsive diode 18 and a blocking diode 20. Each of these diodes has associated with it a capacitance formed by its electrodes. The two electrodes of the photodiode 18 form a capacitor 22, and the two electrodes of the blocking diode 20 form a capacitor 24. Since the rectifying junctions of the diodes 18 and 20 are located between the electrodes of the capacitors 22 and 24, respectively, those diodes operate as if they were connected electrically in parallel with those capacitors, as is illustrated schematically in FIG. 1.

The y lines 16 are driven by column select and drive circuitry 26. This circuitry provides zero volts to all of the y lines except for a selected one, to which it supplies +5 volts. The x lines 14 are each connected through a pull-up resistor 28 to a +5 volt power supply 30. Each of the x lines 14 are also connected to one input of a multiplexer 32. The multiplexer 32 connects a selected one of the x lines 14 to its output 34, which is supplied to the input of an amplifier 36. As is described below in greater detail, the output 38 of the amplifier 36 provides a signal which successively indicates the amount of light incident upon each of the photosensitive elements 12. The voltages to which the selected y line 16 and the pull-up resistors 28 are connected are both selected to be +5 volts in the embodiment illustrated, since it is a convenient voltage commonly associated with electronic circuitry. Of course, other voltage values could be used without materially affecting the invention's principles of operation.

Referring now to FIGS. 2a through 8a and FIGS. 2b through 8b, the operation of the circuitry shown in FIG. 1 will be described. FIGS. 2b through 8b show the voltages and current flows in the photosensitive element 12a in the upper left hand corner of the 3×3 array shown in FIG. 1. The location of this element is indicated schematically in FIGS. 2a through 8a by the circle surrounding the intersection between the upper most x line 14 and the left most y line 16a.

The amplifier 36 is constructed so that it drives its input to zero volts. As is well known in the electronic arts, this can be accomplished by the use as an operational amplifier with a resistive feedback loop connected between its output and its input. Such an amplifier is a current to voltage converter, often called a transconductance amplifier. The input voltage to such an amplifier typically varies by less than 0.001 volts, and thus such voltage variations can be ignored in this discussion. As a result of the operation of amplifier 36, the individual x line 14 which is connected at any given moment by the multiplexer 32 to the input of that amplifier has its voltage level driven to 0 volts. All the other x lines 14 have their voltage level pulled up to +5 volts by the pull-up resistors 28 connected to the +5 voltage supply 30.

Figure 2A:
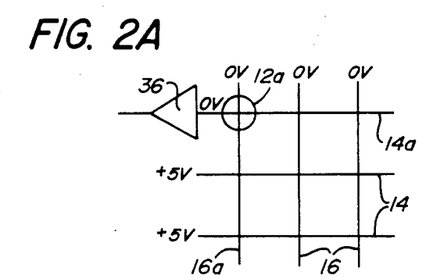
Figure 2B:
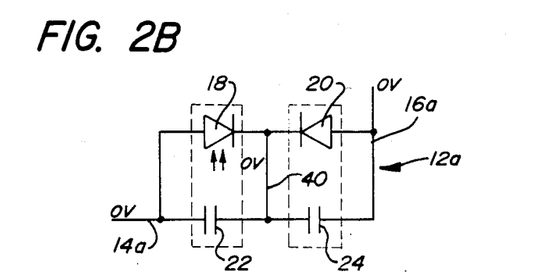

FIGS. 2a and 2b show the state of the photosensitive element 12a before any voltages have been applied. In this initial state both the x line 14a and the y line 16a are at 0 volts, and thus the two capacitors 22 and 24 are not yet charged, and the connection 40 which joins them is at 0 volts.

Figure 3A:
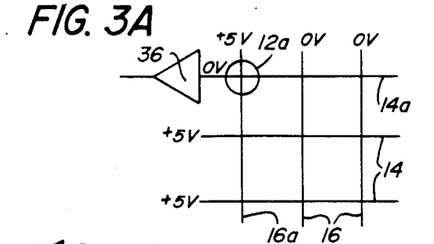
Figure 3B:
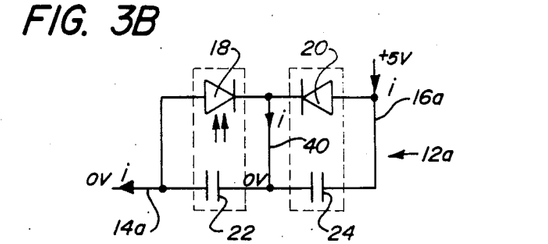

When the column select and drive circuitry 26 and the multiplexer 32 select element 12a, the select and drive circuitry 26 provides +5 volts to y line 16a and 0 volts to all other y lines. During the selection of element 12a, the amplifier 36 causes x line 14a to be driven to 0 volts, while all the other x lines 14 are pulled to +5 volts through the resistors 28. This is shown schematically in FIG. 3a. As is shown in FIG. 3b, when this voltage scheme is first applied to the element 12a, current flows down the address line 16a and through the blocking diode 20 and the connection 40 to charge up the capacitor 22. The capacitive coupling through capacitor 22 to the x line 14a, causes a corresponding flow of current in line 14a toward the input of the operational amplifier 36. As can be seen from FIG. 3b, the diode 20 is forward-biased with regard to the flow of current from the y line 16a toward the capacitor 22. Thus it provides relatively little impedance to such current. The diode 20 is designed so that the capacitance 24 of its electrodes is relatively small and thus can be substantially neglected for purposes of determining the operation of an element 12. However, as can be seen from FIG. 3b, the diode 18 is reverse-biased relative to the current flowing from the y line 16a toward the x line 14a. As a result, the diode 18 offers a high impedance to the flow of such current across it, and thus the voltage drop across the diode 18 and the resulting charge across capacitor 22 is substantially equal to the +5 volt difference applied between lines 16a and 14a.

Figure 4A:
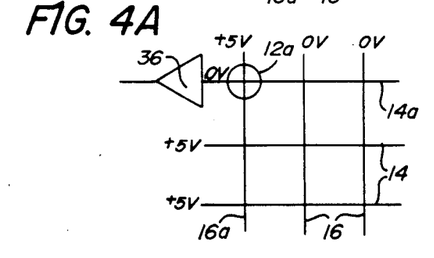
Figure 4B:
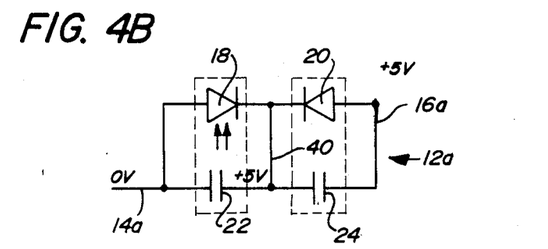

As is shown in FIGS. 4a and 4b, by the end of its select period, the element 12a has its capacitor 22 charged to +5 volts, preventing any further current from flowing from line 16a to line 14a other than a relatively small instantaneous reverse leakage current across diode 18. This discussion assumes for simplicity that the diodes have no voltage drop when conducting in the forward direction. The diodes actually do have a small voltage drop, but this fact does not materially affect the principles of operation taught here.

Figure 5A:
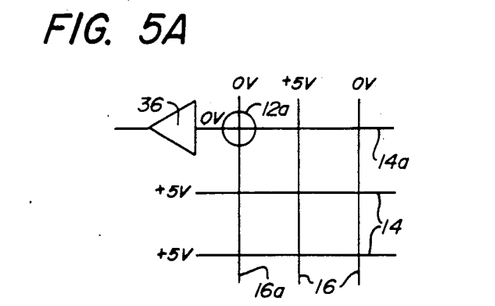
Figure 5B:
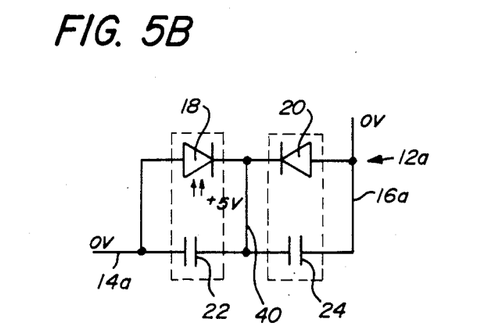

In the embodiment of the invention shown in FIG. 1, the column select and drive circuitry 26 and the multiplexer 32 are normally controlled to select each of the photosensitive elements 12 in a sequential scanning method in which each row, and each elements within each row, are successively selected. FIG. 5a shows the state of the element 12a during the period in which subsequent elements in its row 14a are being selected. During this period the x line 14a is still held to 0 volts by the amplifier 36, but the select and drive circuitry 26 holds the y line 16a to 0 volts, instead of the +5 volts to which it is held when element 12a is selected. However, the charge on the capacitor 22 is not altered by this state of affairs, since the blocking diode 20 is reverse-biased by the voltage applied between contact 40 and line 16a, and thus it substantially prevents the discharge of capacitor 22. Of course, there will be a small change in the voltage on contact 40 when y line 16a changes voltage, due to the capacity divider effect between capacitors 22 and 24. However, since the capacitance 24 is much smaller than the capacitance 22, this change can be ignored in this discussion. In any case, this change is compensated for when line 16a goes to +5 volts on the next readout cycle.

Figure 6A:
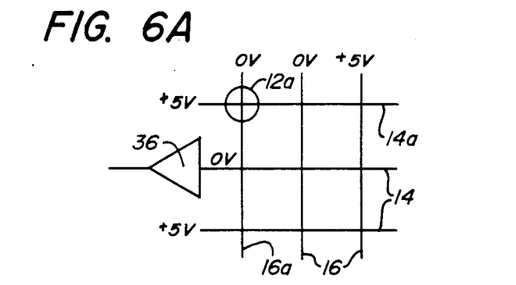
Figure 6B:
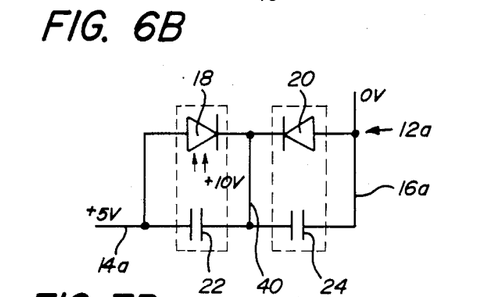

The blocking diode 20 also prevents the voltage on capacitor 22 from being discharged when other rows are selected by multiplexer 32. As is indicated in FIGS. 6a and 6b, when multiplexer 32 selects an x line other than the line 14a, the line 14a is pulled-up to +5 volts by one of the pull-up resistors 28. It also shows that when the column select and drive circuitry 26 selects a y line other than the line 16a, the line 16a is supplied with 0 volts. This means that capactor 22 has +5 volts connected to its side which was formerly at 0 volts, driving the other side of the capacitor 22, connected to contact 40, to +10 volts, provided that the +5 volt charge previously placed on capacitor 22 has not been lost. During this state the blocking diode 20 inhibits charge on capacitor 22 from being lost to the y line 16a, which is at 0 volts.

Figure 7A:
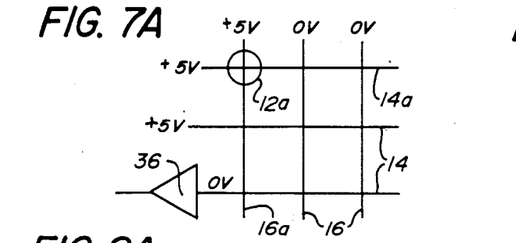
Figure 7B:
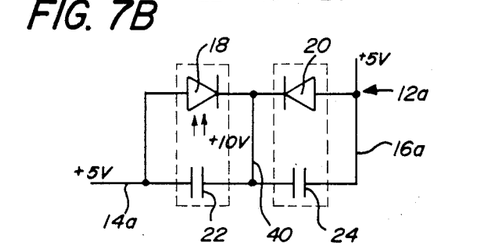

FIGS. 7a and 7b show what happens when the y line 16a is selected during a period when an x line other than line 14a is selected. In this case both the x and y lines of the element 12a are supplied with a positive +5 volts. As a result, the contact 40 is driven +10 volts, provided capacitor 22 still has the +5 volts charge initially supplied it. During this state the blocking diode 20 continues to inhibit the charge on capacitor 22 from being lost to the y line 16a.

Figure 8A:
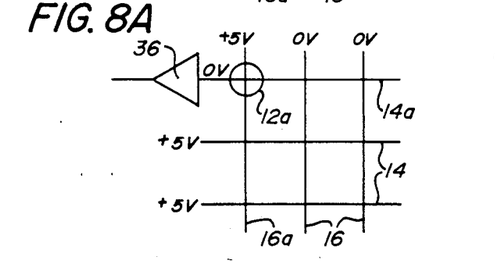
Figure 8B:
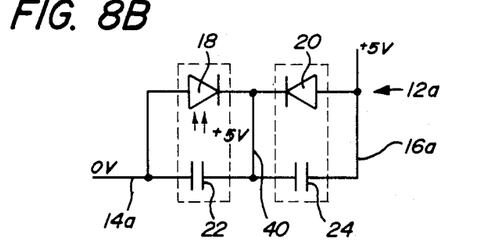

FIG. 8 shows what happens when the element 12a is again selected by both the multiplexer 32 and the select and drive circuit 26. In this case voltages are again applied to the element 12a which are identical to those shown in FIG. 3b. However, no current flows to capacitor 22 unless that capacitor has lost charge since the last time it was selected, because unless such charge has been lost, the capacitor 22 already has a voltage equal to the voltage difference between y line 16a and x line 14a.

However, if light hits the diode 18 between the successive rechargings of its associated capacitance 22, something will be done to discharge that capacitance. This is because the diodes 18 are photoresponsive diodes, in which the reverse leakage current is greatly increased in the presence of light. When light hits the semiconductor material of such a diode, it generates electron-hole pairs which are swept by the field across such a diode in a direction that discharges the voltage generating that field. The more the light strikes a diode 18 between the rechargings of its associated capacitor 22, the more the charge on that capacitor is lost. As a result of this lost charge, the voltage left on capacitor 22 is less than the voltage applied across it when the capacitor is next recharged, causing current to flow onto the capacitor 22 during its recharging. Because of capacitive coupling across capacitor 22, current flow to capacitor during its recharging causes current to flow in the capacitor's x line 14 to the amplifier 36, creating an signal at the output of that amplifier. The amount of such current is in proportion to the amount by which the capacitor 22 has been discharged by incident radiation since its previous recharging.

All of the photoresponsive elements 12 function in a manner similar to that of the element 12a just described. Thus the signal at the output of amplifier 36 varies in correspondence to the magnitude and time incidence of radiation incident upon the semiconductor material of each diode 18 during the entire period between its successive rechargings. In other words, the signal which results when a given photodiode is selected is not an instantaneous function of the amount of light falling on that photodiode during its selection, but rather is a function of all the radiation incident upon that photodiode during the entire period since its previous recharging. As a result, the apparatus of the present invention provides a much greater sensitivity and a much greater immunity to noise.

The current flow during the recharging of a given capacitor 22 is not constant. Instead it varies during the recharging period, with the amount of such current increasing rapidly to a maximum value at the beginning of each recharging period and then decreasing more slowly as the voltage on the capacitor approaches the voltage applied across it. Once the capacitor is completely charged, the current is limited to the relatively small instantaneous value of the reverse leakage current across its associated diode 18. Thus, the output signal produced by amplifier 36 in association with the selection of a given picture element is not a constant value, but rather a current pulse starting with a relatively rapid increase and ending with a relatively slow decrease. The actual rates of the increase and decrease depend upon many parameters, among them, the impedance of the driving circuitry, stray capacitance, and the time response characteristic of the diodes.

This output is used in different ways in different embodiments of the invention to indicate the amount of light which has hit each of the photosensitive elements. In some embodiments the output of amplifier 36 is integrated over the recharging period of each photosensitive element by means of an integrating amplifier. This is perhaps the most accurate method. In other embodiments, a sample and hold circuit is used to sample the magnitude of the output of amplifier 36 at a specified time during the recharging period of each picture element, such as the time at which that signal is at its maximum value. The resulting sampled value is then used as the indication of the amount of light which has hit the associated photoresponsive element since its last recharging. In other embodiments, the output of amplifier 36 is fed as a video signal to a cathode-ray-tube having a scanning pattern and rate similar to the array of photosensors 12. In such an embodiment, even though the amplitude of the video signal varies over the portion of a video line associated with a given photosensitive element, this is normally of little concern since the corresponding picture elements are close together on the CRT screen, and since such high frequency variations in the video signal can be reduced by the use of a low pass filter.

Referring now to FIGS. 9, 10 and 11, a radiation sensing apparatus formed as an integrated circuit according to the present invention is shown. The radiation sensing apparatus shown in those figures comprises a substrate 41 formed of glass. In alternate embodiments of the invention other insulating substrates can be used, such as substrates formed of conductive materials, for example, stainless steel, coated with an insulator to provide the necessary electrical isolation for devices formed their surface. A layer 42 formed of molybdenum or another metal which forms a good ohmic contact with P+ type amorphous silicon alloys is deposited upon the substrate 41 by means such as sputtering, and then is patterned by photolithographic techniques to form the y address lines 16, the bottom electrodes 44 of the photoresponsive diode 18, and an extension of that bottom electrode which forms part of the address lines 14. Once the metal layer 42 has been patterned, three successive layers of amorphous semiconductor material are deposited upon the substrate 40, first a P+ layer 46 having a thickness of approximately 250 angstroms, then a substantially intrinsic, or I layer 48 having a thickness of approximately 3,500 angstroms, and then an N+ layer 50 having a thickness of approximately 250 angstroms. The deposited semiconductor material is preferably an amorphous semiconductor alloy including silicon. The amorphous silicon alloy can also include hydrogen and/or fluorine and can be deposited by plasma assisted chemical vapor deposition, i.e. glow discharge as disclosed, for example, in U.S. Pat. No. 4,226,898 which issued on Oct. 7, 1980 in the names of Stanford R. Ovshinsky and Arun Madan for "Amorphous Semiconductors Equivalent To Crystalline Semiconductors Produced By Glow Discharge Process." The disclosure of the '898 Patent is hereby incorporated by reference.

Amorphous silicon alloys can be deposited in multiple layers over large area substrates to form structures such as the integrated circuit shown in FIGS. 9, 10 and 11 in high volume, continuous processing systems. Continuous processing systems of this kind are disclosed, for example, in U.S. Pat. No. 4,400,409, issued Aug. 23, 1983 for "A Method Of Making P-Doped Silicon Films And Devices Made Therefrom"; U.S. patent application Ser. No. 244,386, filed Mar. 16, 1981 for "Continuous Systems For Depositing Amorphous Semiconductor Material"; U.S. Pat. No. 4,410,558, issued Oct. 18, 1983 for "Continuous Amorphous Solar Cell Production Systems"; U.S. Pat. No. 4,438,723 issued Mar. 27, 1984 for "Multiple Chamber Deposition And Isolation System And Method"; and U.S. patent application Ser. No. 359,825, filed Mar. 19, 1982 for "Method And Apparatus For Continuously Producing Tandem Amorphous Photovoltaic Cells". As disclosed in these patents and applications, which are incorporated herein by reference, a substrate may be continuously advanced through a succession of deposition chambers, wherein each chamber is dedicated to the deposition of a specific material.

For example, in making the P-I-N layers 46, 48 and 50 shown in FIGS. 10 and 11, a single deposition chamber can be used for batch processing, or preferably, a multiple chamber system can be used wherein a first chamber is used for depositing a P+type amorphous silicon alloy, a second chamber is used for depositing an intrinsic amorphous silicon alloy, and a third chamber is used for depositing a N+type of amorphous silicon alloy. Since each deposited alloy, and especially the intrinsic alloy, must be of high purity, the deposition environment in the intrinsic deposition chamber is preferably isolated from undesirable doping constituents within the other chambers to provide the diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be swept about the web of substrate material. In the previously mentioned patents and patent applications, deposition of the amorphous silicon alloy material onto the large area continuous substrate is accomplished by glow discharge decomposition process gases. Among these processes, radio frequency energy glow discharge processes have been found to be suitable for the continuous production of amorphous semiconductor. An improved process for making amorphous semiconductor alloys and devices is disclosed in the copending U.S. patent application Ser. No. 423,424, filed Sept. 24, 1982 for "A Method Of Making Amorphous Semiconductor Alloys And Devices Using Microwave Energy", which is incorporated herein by reference. This process utilizes microwave energy to decompose the reaction gases to cause deposition of improved amorphous semiconductor materials. This process provides substantially increased deposition rates and reaction gas feed stock utilization. Microwave glow discharge processes can also be utilized in high volume mass production of devices, as disclosed in copending U.S. patent application Ser. No. 441,280, filed Nov. 12, 1982, for "An Improved Apparatus For Manufacture Of Photovoltaic Devices", and to make layered structures, as is disclosed in copending U.S. patent application Ser. No. 565,033, filed Dec. 23, 1983, for "Method And Apparatus For Making Layered Amorphous Semiconductor Alloys Using Microwave Energy", both of which applications are incorporated herein by reference.

After the P-I-N layers 46, 48 and 50 have been deposited across the entire surface of the substrate 41, a thin layer 52 of a transparent conductor such as indium tin oxide is deposited on top of the N+ layer 50. Such a layer is preferably between 200 and 500 angstroms thick. Once the multilayered structure comprised of the P+ layer 46, the intrinsic layer 48, the N+ layer 50 and the indium tin oxide layer 52 has been formed over the entire surface of the substrate 40, photolithographic techniques are used to etch that combined layer into an array of diode pairs with one such diode pair for each photosensitive element 12 to be formed. Each of the diode pairs includes a large diode forming the photodiode 18 of its photosensitive element and having an area of approximately 200 microns by 200 microns. Each of the diode pairs also includes a much smaller diode forming the blocking diode 20 and having an area of approximately 30 microns by 30 microns. The bottom electrode of the photodiode 18 is formed by the molybdenum electrode 44, and the top electrode of that diode is formed by the ITO layer 52. Similarly, the bottom electrode of the blocking diode 20 is formed by a portion of the address line 16 and the top electrode of that diode is formed by a portion of the ITO layer 52. The relatively large overlapping area of the electrodes of photodiode 18 provide that diode with a relatively large capacitance. The much smaller area of the blocking diode 20 causes the capacitance 24 associated with its top and bottom electrodes to be much less.

Once the diodes 18 and 20 have been formed, the entire substrate 40 is covered with a thin transparent insulating layer 54. Preferably this insulating layer 54 is formed of polyimide, which can be placed over the substrate 40 and the structures formed upon it by roller, extrusion, or spin-coating. Alternatively, the insulating material in layer 54 could be formed from a deposited insulating material, such as silicon oxide or silicon nitride. Once the transparent layer 54 has been deposited, photolithographic techniques are used to form a contact opening 56 through a portion of layer 54 on top of photodiode 18 and a similar contact opening 58 through a portion of layer 54 on top of blocking diode 20. Similarly, a contact opening 60 is formed over the bottom right hand corner (as shown in FIG. 9) of the bottom electrode 44 of photodiode 18, and another contact opening 62 is formed in the leftmost extension (as shown in FIG. 9) of the bottom electrode 44 which forms part of its associated x line 14. When these contact openings have been formed, a layer of metal such as aluminum is deposited and patterned to form the connection 40 between openings 56 and 58 of each diode pair, connecting the cathodes of diodes 18 and 20. This top metal layer is also patterned to form a connecting link 64 between adjacent contact openings 60 and 62, so as to connect all of the bottom electrodes of the diodes 18 in a given row, and thus complete the address line 14 associated with that row. The metal contact 40 covers the blocking diode 20 from light, although this is not clearly shown in FIG. 11, in which the vertical scale has been greatly exaggerated for purposes of illustration.

Once the integrated circuit has been formed in the manner described, it is preferable to coat it with a passivation layer (not shown), such as one formed of polyimide, to protect the top metal links 40 and 64 from oxidation.

The structure shown in FIGS. 9 through 11 forms an array of photosensitive elements 12 of the type shown in FIG. 1. Since amorphous silicon alloys have very low dark conductivities and very high photoconductivities, the photodiodes 18 form very sensitive photoresponsive devices. As a result, the structure shown in FIGS. 9 through 11 forms an excellent photosensitive array.

Figure 12:
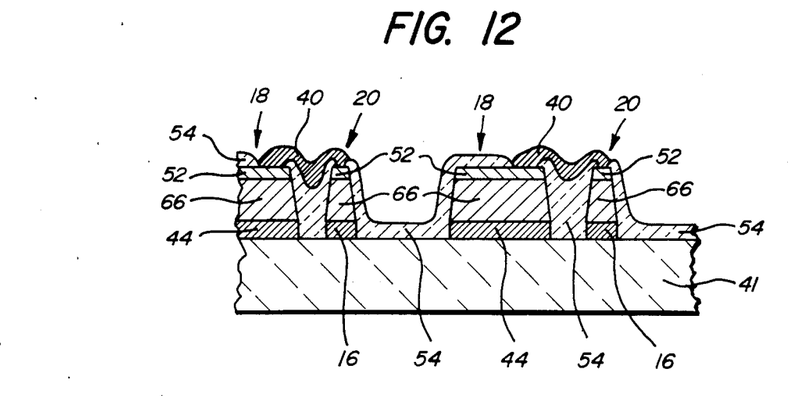
FIG. 12 is a partial cross-sectional side view of an integrated circuit similar to that shown in FIG. 11 except that the diode formed by its semiconductor layer is a Schottky diode formed by the contact of that semiconductor layer with its bottom metal layer, rather than a PIN diode as in FIG. 11.

Referring now to FIG. 12, an alternative embodiment of the invention is shown which is also electrically equivalent to the schematic diagram shown in FIG. 1. The structure in FIG. 12 is identical to that in FIG. 11, except that its address lines 16, which form the bottom electrodes of its blocking diodes 20, and the bottom electrodes 44 of its photodiodes 18 are formed of a metal, such as palladium or platinum, which forms a Schottky barrier when placed in contact with intrinsic amorphous silicon. The structure of FIG. 12 is also distinguished from that shown in FIG. 11 by having only one layer 66 of intrinsic amorphous semiconductor material between the electrodes of its diodes 18 and 20, rather than the three P-I-N layers 46, 48 and 50 as in FIG. 11. The platinum or palladium metal of the bottom electrodes of the diodes 18 and 20 form the anodes of those diodes, and the intrinsic silicon alloy layer 66 forms the cathodes, causing the diodes 18 and 20 shown in FIG. 12 to have the same polarity as the PIN diodes shown in FIG. 11. In embodiments in which it is desired to improve the ohmic nature of the contact between the top ITO electrodes 52 and the intrinsic layer 66, a thin layer of N+ silicon alloy is placed between that ITO electrode and the intrinsic layer.

Figure 13:
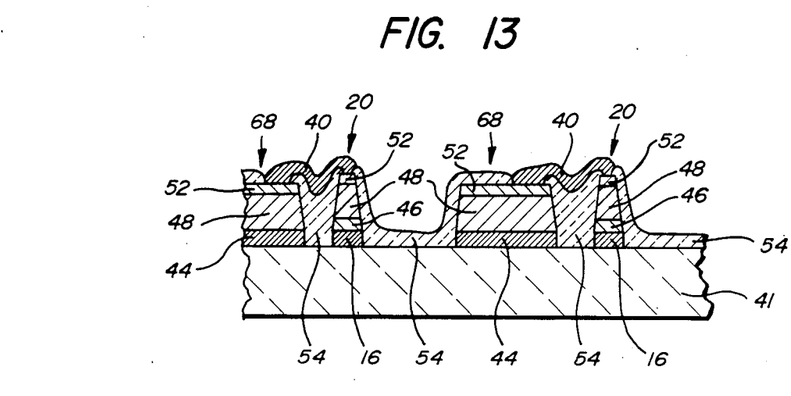
FIG. 13 is a partial cross-sectional side view of an integrated circuit similar to that shown in FIG. 11, except that the semiconductor region associated with its photosensitive element does not form a diode, but instead acts as a photoresistor.

FIG. 13 shows another embodiment of the invention, which is identical to that in FIG. 11 except the diode 18 has been replaced with a photoresistor 68. The photoresistor 68 is comprised of the single layer 48 of intrinsic amorphous silicon alloy, placed between a bottom metal electrode 44 and a top ITO electrode 52, both identical to those shown FIG. 11. Photolithographic techniques prevent the P+ and N+ layers 46 and 50 used in the P-I-N blocking diode 20 from being deposited between the electrodes of photoresistor 68. Thus, the photoresistor 68 does not have diode characteristics. But since the intrinsic amorphous silicon alloy of layer 48 has a high dark resistivity while exhibiting a substantial photoconductivity, the device 68 functions much like the diode 18 for the purpose of the present invention. That is, in the absence of light it tends to maintain electrical charge placed upon the capacitor 22 formed by its top and bottom electrodes, and it discharges that electric charge in proportion to the amount of light which falls upon it.

Figure 14:
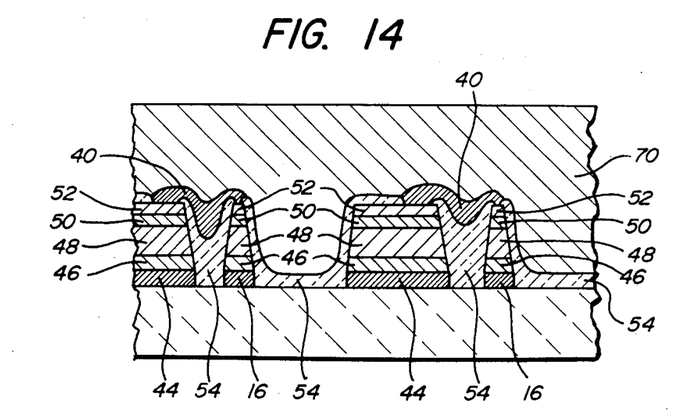
FIG. 14 is a partial cross-sectional side view of an integrated circuit substantially identical to that shown in FIG. 11 except that it is covered with a layer of fluorescent material.

FIG. 14 shows an embodiment of the present invention for sensing x-ray images. This apparatus is virtually identical to that shown in FIG. 11, with the exception that a layer of fluorescent material several hundred microns thick has been placed over it. Suitable fluroescent materials for such a layer include lanthanum oxysulfide with terbium, gadolinium oxysulfide with terbium, ytterbium oxysulfide with terbium, barium fluorochloride with europium, ytterbium oxides with gadolinium, or barium orthophosphate with europium. The thickness of this layer is not drawn to scale for purposes of convenience. When x-ray radiation falls upon the fluorescent layer 70 it generates light photons having a frequency which causes the generation of charge carriers in the photodiodes 18 of its associated photoresponsive elements. As a result, the amount of current required to recharge the capacitance of each of the photodiodes 18 is a function of the amount of x-ray radiation incident upon the portion of the fluorescent layer 70 overlying each such diode. Thus an array of photoresponsive elements 12 coated with the fluorescent layer 70 enables x-ray images to be electronically sensed.

In certain uses of x-ray imaging, such as certain medical uses, it is often desirable to have image sensing elements which are accurate over a broad dynamic range. With the present invention such accuracy can be achieved by the use of calibration techniques which measures the readings produced by each photosensitive element 12 in response to known levels of incident radiation and use a computer having such calibration information to adjust the output of each photosensitive element in correspondence with such calibration data. For maximum results such calibration should compensate not only for the differing photoresponsive characteristics of each photodiode 18, but also for the light-independent reverse leakage current of each such photodiode. Typically photodiodes of the type described in regard to FIG. 9 through 11 have a leakage current in the dark which is less than one thousandth that of the photoinduced leakage current which they generate in normal room light. This difference is great enough so that the output signal produced can be used for many purposes without compensation for such light-independent leakage current. But in situations where a high dynamic range of light sensitivity is required, a computer is used to adjust for such leakage current.

In order to achieve a desired range of light sensitivity it is also important to choose the proper length of time between the recharging of the picture elements 12. A good length of time is one that is just long enough to allow the recharging voltage placed on the element to be completely discharged by light at the top end of the range of light intensities which the element is intended to measure. If the time is shorter than this, the time during which a photodiode has to integrate light incident upon it will not be enough to produce a maximum signal. If the time is longer, the capacitor 22 will be totally discharged by a whole sub-range of light intensities falling within the range of intensities to be measured, having the undesirable effect of making it impossible to distinguish between any such light intensities falling within that sub-range. If the time between recharging is made extremely long, the light-independent leakage current will totally discharge the capacitors 22 by itself, making it impossible to measure any signal produced by the incidence of light on the photodiodes.

In some large arrays constructed in the general manner shown in FIG. 1, the time between recharging is reduced by connecting the pull-up resistors 28 attached to each x line to ground instead of to +5 volts. This causes all the photoresponsive elements 12 in a given column to be recharged in parallel each time the y line 16 associated with that column is supplied with +5 volts. As a result, each element 12 is recharged once during the scanning of each row. The resistance of the resistors 28 is sufficiently large so that the recharging current which flows to ground from unselected x lines is isolated from the recharging current which flows to the amplifier 36 from the selected x line. This enables the recharging currents in the selected row to be read independently of the recharging currents in nonselected rows. This recharging method is particularly suitable for use with large high - resolution arrays used in contact document copier of the type discussed below.

One of the advantages of the present invention is that it enables a sensing apparatus to be constructed in which the individual elements can be randomly addressed. For example, in the apparatus disclosed in FIG. 1, any given photoresponsive element 12 can be read by: (a) selecting its associated x and y lines to charge it, (b) subsequently selecting those lines again after a known period of time has elapsed to recharge it, and, (c) measuring the current that flows during such recharging. This random addressability means that the time between recharging can be selectively varied over different portions of the display to vary the range of light intensity over which those portions are responsive. Such random addressibility also allows a large array to be scanned quickly by reading only a representative sample of its photoresponsive elements, while allowing the option for more detailed image scanning when and where desired.

Figure 15:
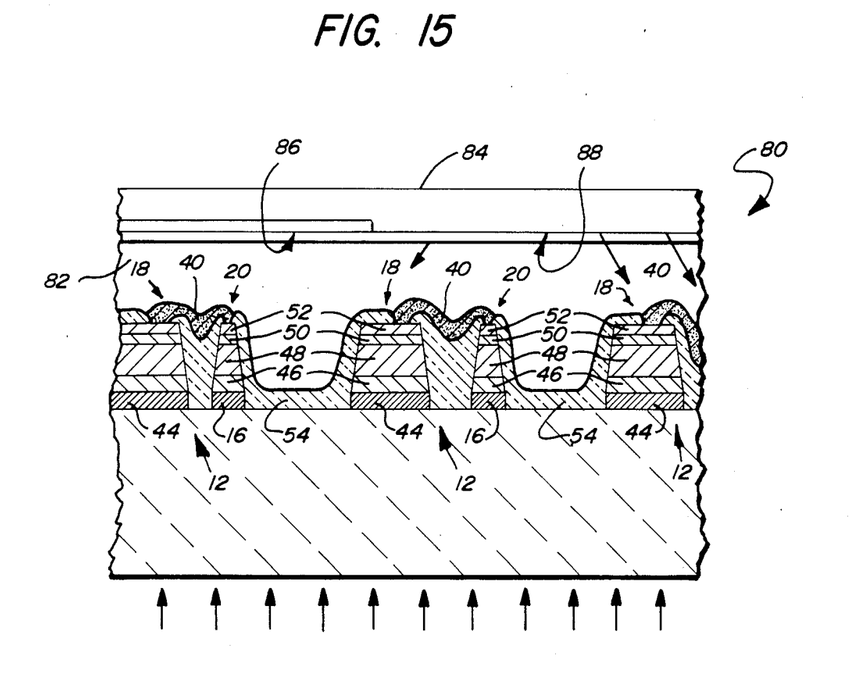
FIG. 15 is a cross-sectional side view of an incident radiation sensing apparatus according to the present invention for use in forming an image of a document placed in close proximity to its array of photosensitive elements, with a portion of such a document being shown.

FIG. 15 shows an image sensing apparatus 80 according to an embodiment of the invention which is designed for use in forming images of documents placed in close proximity to its array of photosensitive elements. The apparatus 80 includes an array of photosensitive elements 12 similar to those shown in FIG. 11. However, the glass substrate 40 of apparatus 80 is substantially thicker than shown in FIG. 11, so that documents and books can be placed upon it without its being broken by their weight. In addition, the apparatus 80 has placed over its insulating layer 54 and its top metal contacts 40 and 64 a layer 82 of sputtered silicon dioxide ($SiO_2$) or silicon nitride ($Si_3Cn_4$) to form a hard, transparent, substantially flat oxide layer approximately 100 microns thick. The apparatus 80 shown in FIG. 15 is designed for copying opaque documents, such as the document 84 partially shown in FIG. 15. The photosensitive elements 12 are spaced sufficiently far apart to allow a substantial amount of the light entering the substrate 40 from its backside, as indicated by arrows in FIG. 15, to pass between such elements, and illuminate the surface of a document facing the transparent oxide surface 82. Each individual photosensitive element 12 responds primarily to the amount of light reflected from the portion of document 84 placed closest to it. For example, in FIG. 15 the document 84 is shown as having a darkened portion 86 upon its bottom surface, such as part of an inked letter of text. Since relatively little light is reflected from this darkened portion 86, the photosensitive elements 12 beneath it receive little reflected light. However, a relatively large amount of light is reflected from the light portion 88 on the bottom surface of document 84, and thus the photsensitive elements 12 below that portion receive more light. It is important that the metal which forms the bottom electrodes of the diodes 18 and 20 be over 2,000 angstroms thick, so as to prevent radiation from below those diodes from impinging directly upon them.

In order to form accurate copies of documents such as business letters and pages from books and magazines, it is desirable that the sensing apparatus 80 have a resolution of at least 4 points per millimeter, and, preferably, of 8 points per millimeter. To form a sensor with a resolution of 8 points per millimeter the photosensitive elements 12 should be spaced every 125 microns, and the oxide layer 82 should be no more than approximately 100 microns thick. One of the advantages of the present invention is that it can be used to form an array of photosensitive elements that is at least 11" long and 8½" wide as a single integrated circuit. This is because the deposited semiconductor materials used to form the image sensing apparatus of the present invention can be deposited over large areas, as is described above, and do not require crystalline substrates, which are presently limited in size. Thus the present invention makes it possible to make a solid state document imaging device with no moving parts, with the imaging element formed as one integrated circuit on a single glass substrate.

Figure 16:
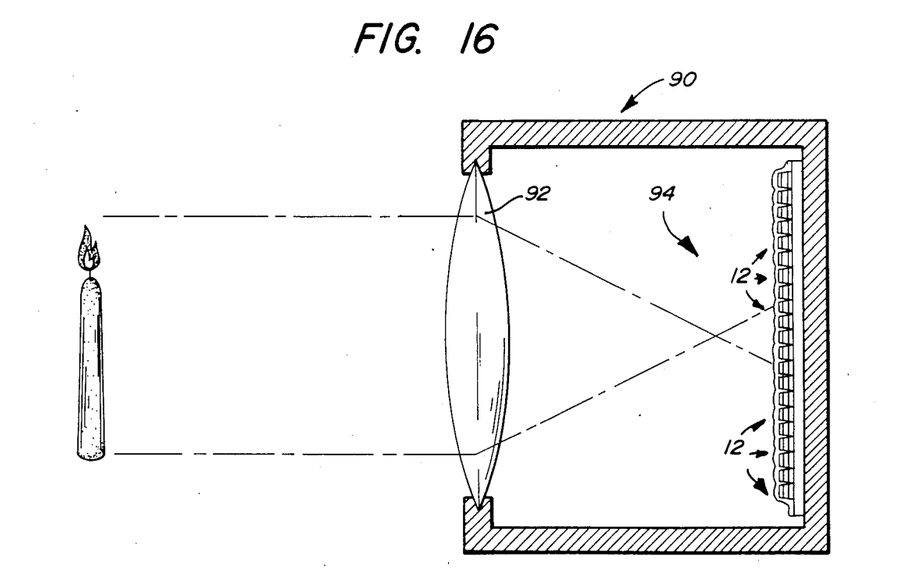
FIG. 16 is a cross-sectional side view of an incident radiation sensing apparatus according to the present invention which includes focusing means for focusing a light image upon its array of photosensitive elements.

Referring now to FIG. 16, an incident radiation sensing apparatus 90 according to the present invention is shown in schematic form. The apparatus 90 includes a focusing means, such as a lens 92 for focusing a light image upon an array 94 of photosensitive elements 12. In the embodiment shown, the array of photosensitive elements 12 is a structure such as that shown in FIGS. 9 through 11. Experiments have shown that such photosensitive arrays have sufficient sensitivity to produce images of object illuminated in normal room light when scanned at a video rate and used in conjunction with a lens having an aperture of F4. Thus the present invention is suitable for use in video cameras as well as electronic still cameras.

From the foregoing it is apparent that incident radiation sensing apparatuses according to the present invention can be employed in a variety of radiation sensing applications including not only x-ray imaging, document copying, and electronic photographs, but also any other application in-which it is desirable to sense a spatial distribution of radiation. It is recognized, of course, that those skilled in the art may make various modifications or additions to the preferred embodiments chosen to illustrate the invention without departing from the spirit and scope of the present contribution to the art.

We claim:

1. Incident radiation sensing apparatus for sensing the image or surface condition of a member in close proximity thereto, said apparatus comprising:
    (a) a substrate;
    (b) an array of spaced, substantially opaque photosensitive elements formed as an integrated circuit on said substrate;
    said member maintained in close proximity to said elements, such that said elements are illuminated by the intensity of light emanating from associated portions of said member in close proximity thereto, each of said elements including;
        (i) capacitor means including two spaced apart electrodes for storing charge;
        (ii) conductive means for charging said capacitor means to a preselected magnitude;
        (iii) blocking means for inhibiting the discharge of charge stored on said capacitor means; and
        (iv) photoresponsive means formed from deposited semiconductor material for generating charge carriers at a rate responsive to the intensity of radiation incident upon said photoresponsive means, the deposited semiconductor material of said photoresponsive means located between and electrically connected to the electrodes of said capacitor means so that said semiconductor material forms at least one semiconductor blocking junction which inhibits the discharge of said capacitor in the absence of radiation incident upon said semiconductor material and said charge carriers reduce the magnitude of the charge on said capacitor means as a function of the magnitude of, and the time incidence of, said incident radiation;
    (c) means for sensing the magnitude of charge remaining on at least one of said capacitor means at a preselected period of time after its charging by said conductive means, thereby to produce a signal corresponding to the total amount of incident radiation impinging on said photoresponsive means during said preselected period of time; and,
    (d) transparent spacing means for maintaining said member in close proximity to said array.

2. Incident radiation sensing apparatus as defined in claim 1 wherein:
    a plurality of intersecting lines is formed on said substrate; and
    said conductive means associated with each photosensitive element includes a pair of such intersecting lines.

3. Incident radiation sensing apparatus as defined in claim 2, wherein said means for sensing the magnitude of charge also includes said pair of intersecting lines associated with each photosensitive element.

4. Incident radiation sensing apparatus as defined in claim 2 wherein:
    said plurality of intersecting lines includes a plurality of generally parallel x lines and a plurality of generally parallel y lines crossing said x lines;
    said photosensitive elements are formed at the crossings of said x and y lines; and
    said conductive means associated with each photosensitive element includes one x line and one y line.

5. Incident radiation sensing apparatus as defined in claim 1, wherein said blocking means is connected between said capacitor means and at least a part of said conductive means so as to inhibit the discharge of said capacitor means through said conductive means.

6. Incident radiation sensing apparatus as defined in claim 1, wherein said blocking means includes a semiconductor blocking junction.

7. Incident radiation sensing apparatus as defined in claim 6, wherein said blocking means includes a diode.

8. Incident radiation sensing apparatus as defined in claim 1, wherein;
said conductive means for charging further includes means for recharging said capacitor means after the expiration of said preselected period of time; and
said means for sensing the magnitude of charge includes means for sensing the amount of current which flows during said recharging of said capacitor means.

9. Incident radiation sensing apparatus as defined in claim 1, wherein said electrodes of said capacitor are vertically arrayed with respect to each other and said substrate; and said semiconductor material of said photoresponsive means is deposited between said electrodes so as to act as a dielectric between them.

10. Incident radiation sensing apparatus as defined in claim 1, wherein said semiconductor material of said photoresponsive means includes an amorphous semiconductor alloy.

11. Incident radiation sensing apparatus as defined in claim 10, wherein said amorphous semiconductor alloy includes silicon.

12. Incident radiation sensing apparatus as defined in claim 10, wherein said amorphous semiconductor alloy includes hydrogen.

13. Incident radiation sensing apparatus as defined in claims 10, wherein said amorphous semiconductor alloy includes flourine.

14. Incident radiation sensing apparatus as defined in claim 10, wherein said amorphous semiconductor alloy includes both hydrogen and flourine.

15. Incident radiation sensing apparatus as defined in claim 1, wherein said deposited semiconductor material is formed in at least two layers having their Fermi levels positioned differently relative to the energy levels of their conduction and valence bands, so as to form said blocking junction in said layers.

16. Incident radiation sensing apparatus as defined in claim 15, wherein said deposited semiconductor material includes three layers, including a bottom layer closest to said substrate formed of a first conductivity type, an intermediate layer formed of a substantially intrinsic type, and a top layer formed of a second conductivity type, said first and second conductivity types being selected so the semiconductor junctions between said layers form said at least one semiconductor blocking junction.

17. Incident radiation sensing apparatus as defined in claim 1, wherein at least one of said electrodes of said capacitor is formed of metal which forms said blocking junction with said semiconductor material of said photoresponsive means.

18. Incident radiation sensing apparatus as defined in claim 9, wherein said deposited semiconductor material of said photoresponsive means forms a photoresistor.

19. Incident radiation sensing apparatus as defined in claim 18, wherein said deposited semiconductor material between said electrodes of said capacitor is formed of a single layer of substantially intrinsic amorphous semiconductor alloy.

20. Incident radiation sensing apparatus as defined in claim 1 wherein said integrated circuit in which said array is formed as a large area integrated circuit with said array of photosensitive elements being at least 11 inches long and 8½ inches wide.

21. Incident radiation sensing apparatus as defined in claim 1, for use in sensing an x-ray image, wherein said apparatus further comprises converting means overlying said photosensitive elements for producing radiation in response to the impingement of x-rays upon said converting means, said produced radiation having a frequency which causes the generation of charge carriers in said photoresponsive means of said photosensitive elements, whereby a given photoresponsive means of a given photosensitive element generates charge carriers in correspondence to the amount of x-ray radiation incident upon a portion of said converting means overlying it.

22. Incident radiation sensing apparatus as defined in claim 21 wherein said converting means comprises a layer of fluorescent material placed in close proximity to said array of photosensitive elements.

23. Incident radiation sensing apparatus as defined in claim 1, wherein said apparatus further includes a focusing means for focusing a light image upon said array of photosensitive elements.

24. Incident radiation sensing apparatus as defined in claim 1, wherein said array of photosensitive elements is a two dimensional array comprised of a plurality of rows and columns of said elements.

25. A method of sensing the spatial distribution of radiation comprising:
providing capacitor means including spaced apart electrodes;
providing a plurality of conductive address lines adapted to place a charge across said capacitor means;
providing blocking means adapted to inhibit said charge from flowing off said capacitor means through said conductive address lines;
providing photoresponsive means including a deposited semiconductor material which is disposed between and electrically connected to the electrodes of said capacitor means said semiconductor material forming at least one semiconductor blocking junction which inhibits the discharge of said capacitor in the absence of radiation incident upon said semiconductor material, said semiconductor material adapted to generate charge carriers at a rate responsive to the intensity of radiation incident thereupon so as to discharge the capacitor means at a rate corresponding to the intensity of said incident radiation; and
measuring the charge remaining on said capacitor means a given time after its charging to obtain a measurement of the total amount of radiation which has been incident on its associated photoresponsive means since that charging.

26. A method as in claim 25, wherein said step of providing photoresponsive means includes providing a photodiode formed of deposited semiconductor material as said photoresponsive means, and having said photodiode disposed between the electrodes of said capacitor means so that it is reverse biased by said charge placed across its associated capacitor means.

27. A method as in claim 25, wherein said step of measuring the charge remaining on said capacitor means includes recharging said capacitor means using said address lines and measuring the current flow through an address line during the recharging so as to determine the amount by which said capacitor means had been discharged.

28. A method as in claim 27 wherein;
said address lines form an x - y array of address lines and;
the steps of placing a charge across said capacitor means and recharging said capacitor means includes addressing said capacitor means through said x - y array.

* * * * *